US009232323B2

(12) United States Patent
Rank et al.

(10) Patent No.: US 9,232,323 B2
(45) Date of Patent: Jan. 5, 2016

(54) HEARING AID WITH AUDIO CODEC AND METHOD

(75) Inventors: Mike Lind Rank, Lynge (DK); Preben Kidmose, Lynge (DK); Michael Ungstrup, Lynge (DK); Morten Holm Jensen, Lynge (DK)

(73) Assignee: Widex A/S, Lynge (DK)

( * ) Notice: Subject to any disclaimer, the term of this patent is extended or adjusted under 35 U.S.C. 154(b) by 79 days.

(21) Appl. No.: 13/430,679

(22) Filed: Mar. 26, 2012

(65) Prior Publication Data

US 2012/0177234 A1    Jul. 12, 2012

Related U.S. Application Data

(63) Continuation-in-part of application No. PCT/DK2009/050274, filed on Oct. 15, 2009.

(51) Int. Cl.
*H04R 25/00* (2006.01)
*G10L 19/04* (2013.01)
(Continued)

(52) U.S. Cl.
CPC .............. *H04R 25/554* (2013.01); *G10L 19/04* (2013.01); *G10L 19/00* (2013.01); *G10L 19/06* (2013.01); *G10L 19/08* (2013.01); *H03M 1/00* (2013.01); *H03M 7/30* (2013.01); *H03M 13/00* (2013.01)

(58) Field of Classification Search
CPC .. H04R 25/70; H04R 2225/43; H04R 25/554; H03M 13/00; H03M 7/3082; G10L 19/04; G10L 19/06; G10L 19/032; G10L 19/035; G10L 19/038; G10L 19/00; G10L 19/08; H04L 65/607

USPC .......... 381/314; 704/200, 500, 228, 226, 230, 704/501, 503, 504; 341/50, 51
See application file for complete search history.

(56) References Cited

U.S. PATENT DOCUMENTS 5,073,940 A * 12/1991 Zinser .................. G10L 19/005
704/226
5,327,520 A * 7/1994 Chen ............................ 704/219
(Continued)

FOREIGN PATENT DOCUMENTS

| EP | 1879179 A1 | 1/2008 |
| EP | 1942490 A1 | 7/2008 |
| EP | 2023339 A1 | 2/2009 |

OTHER PUBLICATIONS

International Search Report for PCT/DK2009/050274 dated May 7, 2010.
(Continued)

*Primary Examiner* — Davetta W Goins
*Assistant Examiner* — Oyesola C Ojo
(74) *Attorney, Agent, or Firm* — Sughrue Mion, PLLC

(57) ABSTRACT

A hearing aid comprising a time domain codec. The codec comprises a decoder adapted to generate a decoded output signal based on an input quantization index and an encoder for generating an output quantization index based on an input signal, said encoder comprising said decoder and a predictor receiving an excitation signal derived from said decoder output signal and outputting a prediction signal. The output quantization index is determined by repeated decoding of the quantization indices in order to minimize the error between the input signal and the prediction signal, and the predictor uses a recursive autocorrelation estimate for the error minimization. The invention further provides a method of encoding an audio signal.

26 Claims, 4 Drawing Sheets

(51) Int. Cl.
*G10L 19/00* (2013.01)
*G10L 19/06* (2013.01)
*G10L 19/08* (2013.01)
*H03M 1/00* (2006.01)
*H03M 7/30* (2006.01)
*H03M 13/00* (2006.01)

(56) References Cited

U.S. PATENT DOCUMENTS

| | | | |
|---|---|---|---|
| 5,651,091 A | 7/1997 | Chen | |
| 5,901,158 A * | 5/1999 | Weng et al. | 714/785 |
| 5,925,146 A * | 7/1999 | Murata | H04B 14/068 714/708 |
| 6,751,587 B2 * | 6/2004 | Thyssen | G10L 19/06 704/226 |
| 6,973,258 B1 * | 12/2005 | Yoo | H04N 5/775 348/423.1 |
| 7,171,355 B1 | 1/2007 | Chen | |
| 7,653,250 B2 * | 1/2010 | Jeong | H04N 7/147 348/14.01 |
| 7,933,770 B2 * | 4/2011 | Kruger | G10L 19/12 704/219 |
| 2008/0167882 A1 * | 7/2008 | Okazaki | G10H 7/12 704/503 |

OTHER PUBLICATIONS

Juin-Hwey Chen et al, "A Low-Delay CELP Coder for the CCITT 16 kb/s Speech Coding Standard" IEEE Journal on Selected Areas in Communications, vol. 10, No. 5, Jun. 1992.

* cited by examiner

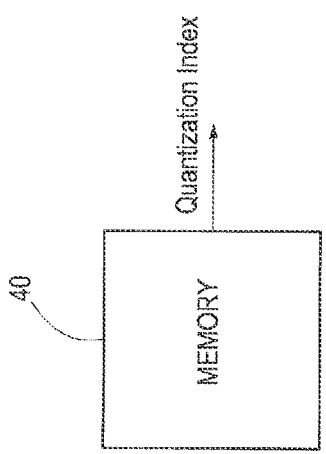
*Fig. 3*
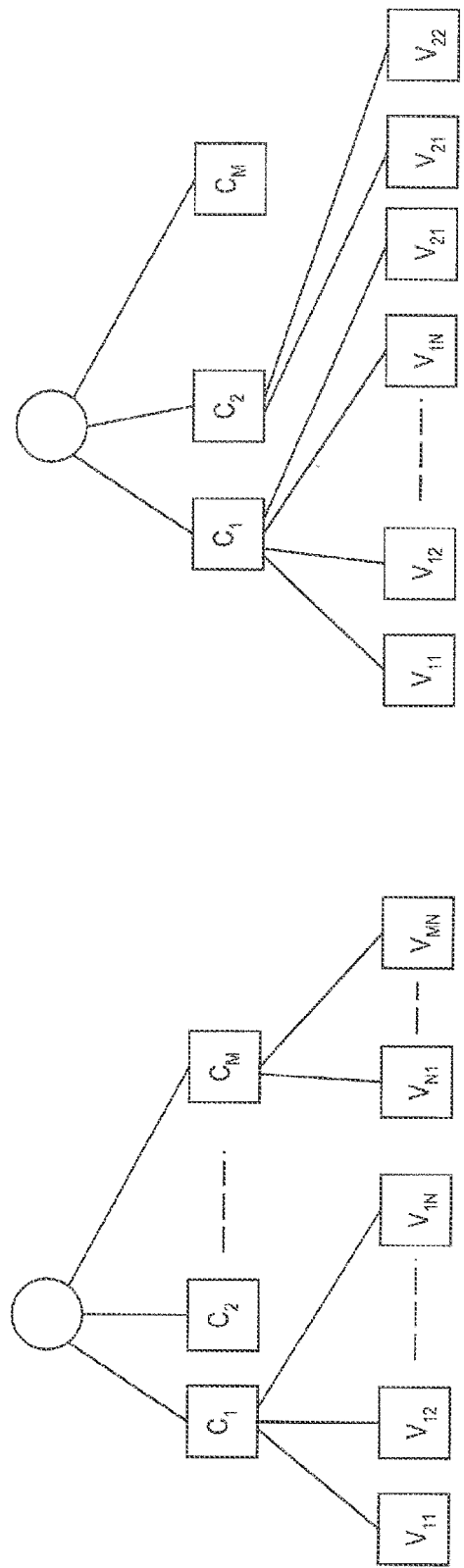
*Fig. 4a*
*Fig. 4b*

HEARING AID WITH AUDIO CODEC AND METHOD

RELATED APPLICATIONS

The present application is a continuation-in-part of application PCT/DK2009/050274, filed on Oct. 15, 2009, in Europe and published as WO2011044898 A1.

BACKGROUND OF THE INVENTION

1. Field of the Invention

The present invention relates to hearing aids. More specifically, it relates to a hearing aid having a time-domain audio codec for decoding and encoding digital audio signals. The invention further relates to a method of decoding and encoding audio signals.

A hearing aid is embodied as a small, wearable unit comprising one or more microphones, a signal processor, and means for acoustically reproducing sound signals. A hearing aid may additionally comprise means for receiving, processing and reproducing sound signals from other sources, such as a telecoil or an FM receiver. In order to alleviate a hearing loss of a user, the signal processor of the hearing aid is configured to amplify selected frequency bands based on a prerecorded audiogram of the user's hearing loss. For flexibility reasons, the signal processor is preferably a digital signal processor.

2. The Prior Art

Modern day hearing aids are typically equipped with means for one- or two-way wireless communication, i.e. radio communication. Such wireless communication may carry sound signals, such as speech, suitable for being transmitted to and from the hearing aid in a digital form, e.g. between two hearing aids or between a hearing aid and another device. In such radio communication, there is a desire for keeping the transmission bit rate as low as possible, one of the reasons for this being that an increase in bandwidth of a radio communication leads to an increased power consumption, which, in turn, is undesired in a hearing aid.

One way to reduce the bit rate in a digital audio signal is to encode and decode the signals using an encoder/decoder unit or processor, commonly referred to as a codec, implemented as a combination of software and more or less dedicated hardware. However, such reduction of the bit rate comes at a cost.

One attempt to reduce the bandwidth and the delay time is described in the article: 'A Low-Delay CELP Coder for the CCITT 16 kb/s Speech Coding Standard', Juin-Hwey Chen et al, IEEE JOURNAL ON SELECTED AREAS IN COMMUNICATIONS, Vol. 10, No. 5, June 1992. The audio bandwidth, reproduction quality and computational complexity described in that article, however, do not meet the needs in a hearing aid.

SUMMARY OF THE INVENTION

It is a feature of the present invention to provide a hearing aid having a codec which overcomes the bandwidth problems mentioned above while keeping the computational complexity low and still achieving an acceptable reproduction quality.

The invention, in a first aspect, provides a hearing aid comprising an audio codec, said codec having a decoder processing part adapted to generate a decoded output signal based on an input quantization index and comprising a predictor and a predictor adaptation block for receiving an excitation signal and outputting a prediction signal, wherein said predictor adaptation block uses a recursive autocorrelation estimate, basing its prediction on previous excitation signals corresponding to the previous output quantization indices, for updating the predictor, an encoder processing part for generating an output quantization index based on a digital audio input signal, said encoder processing part incorporating said decoder processing part, said encoder processing part being adapted for decoding of the quantization indices in a trial-and-error process yielding a number of different quantization indices, and selecting from said number of different quantization indices the quantization index yielding the least difference between the digital audio input signal and the prediction signal as the output quantization index.

By implementing such a codec in a hearing aid, the above criteria as to bandwidth and signal quality may be fulfilled while keeping complexity relatively low due to the fact that the operations necessary for the decoding are similar to those necessary for the encoding. Thus, large parts of the hardware, as implemented on a processing circuit chip, i.e. the dedicated processing parts of the chip used for either encoding or decoding, as the case may be, may be reused. This in turn saves physical space on the chip, as compared to designs having dedicated encoding units and decoding units, thus leading to an overall saving of space in the hearing aid.

According to a preferred embodiment of the invention, the codec comprises means for selectively switching between a scalar quantization mode, and a vector quantization mode.

In the scalar quantization mode, the signal is synthesized from a scalar in a codebook representing the signal shape. In the vector quantization mode, the signal is synthesized from a vector in a codebook representing e.g. a signal shape, a signal gain, and a signal sign.

Having means for operating in one of two different quantization modes, including means for selectively switching between these modes, allows for flexible utilization of the bandwidth during use, e.g. the use of the available bandwidth for the transmission of a mono signal in the scalar quantization mode, or the use of the available bandwidth for the transmission of e.g. a stereo-encoded signal in the vector quantization mode.

According to a further embodiment of the invention, the hearing aid comprises a memory adapted for storing at least one predetermined sequence of quantization indices, and means for feeding at least one such sequence to the codec.

This feature allows the codec to be used not only for reproducing audio signals from a data stream received from an external device, e.g. a corresponding hearing aid, or a dedicated streaming device, but also for selectively switching the codec between a streaming mode and a playback mode in order to play back sounds such as predetermined messages based on a sequence of quantization indices stored in a memory in the hearing aid. Thanks to the analysis-by-synthesis method utilized by the codec, a single quantization index may represent a signal shape encompassing several signal samples rather than the signal samples themselves. Storing a sequence of quantization indices rather than a sampled signal enables the signal to be reconstructed from the sequence of quantization indices when read out to the codec, thus saving valuable space in the hearing aid memory.

In a further embodiment of the invention, the encoder comprises a codebook comprising a plurality of quantization indices, where said quantization indices are arranged in a searchable manner in a tree structure with a number of quantization indices arranged in different branches, and where each individual quantization index is unique to a specific branch. This allows the codebook to be searched in a fast and efficient manner based on classified quantization indices, when repeatedly searching through the codebook in search of the optimum quantization index.

In another embodiment of the invention, the encoder comprises a codebook comprising a plurality of quantization indices, where said quantization indices are arranged in a searchable manner in a tree structure with a number of quantization indices arranged in different branches, and where at least one individual quantization index is found in more than one branch. By overpopulating the search branches with quantization indices from other branches, i.e. other classes, the precision in finding the optimum quantization index may be greatly improved at very little extra computational complexity.

In an alternative embodiment, the encoder comprises a computing device adapted to calculate quantization indices directly from the input signal and the prediction signal. Calculating the indices rather than looking them up in a codebook, eliminates the need for memory capacity for a codebook in the hearing aid.

According to yet to another embodiment of the invention, said decoder comprises a shape codebook and a gain codebook, respectively, for providing a quantization vector representing a shape value and a gain value, respectively. This embodiment enables the shape values in the codebook to be normalized, and utilizes gain values from the gain codebook to scale the normalized, synthesized output signal properly.

In a particularly embodiment of the invention, said gain adaptor is a backward-adaptive gain adaptor. This allows the gain adaptor to adapt to the overall dynamics of the sound signal.

In another embodiment of the invention, the predictor is adapted for using a recursive autocorrelation estimate based on a second- or higher-order autocorrelation model. This has the advantage that little memory capacity is needed to store historical values as compared to correlation models involving a non-recursive part.

In a particular embodiment of the invention, the hearing aid comprises a sample rate converter for altering the sample rate of an audio signal prior to being encoded by the codec. This enables the encoder of the codec to operate on a signal with a sample rate different from the sample rate employed in the hearing aid signal processor. Thus a further reduction in bandwidth requirement for the wireless link may be obtained if the sample rate of the coded signal is less than the sample rate of the hearing aid processor. The conversion from the sample rate of the hearing aid to the sample rate of the codec is performed prior to encoding the signal as a part of the pre-processing, and the conversion from the sample rate of the codec to the sample rate of the hearing aid is performed after decoding as a part of the post-processing before the decoded signals are converted back into audio signals.

In an embodiment of the invention, the hearing aid comprises means for detecting differences in digital clock frequencies between the transmitter and receiver in the transmitted signal and means for modifying the decoded audio signal in order to compensate for the detected differences. This feature enables the receiving hearing aid to accommodate and compensate for the differences in clock frequencies between the received signal and the hearing aid in a way which is inaudible to the wearer of the hearing aid.

In another embodiment of the invention, the means for detecting said differences in clock signal frequencies is a digital phase-locked loop (PLL). This embodiment enables an asynchronous conversion of the sample rate where the sample rate conversion factor is controlled by said digital PLL. This simplifies reception of the signal, as no synchronization signals need to be transmitted in order to get a correctly compensated clock frequency for the sample rate conversion.

In a further embodiment of the invention the hearing aid comprises means for detecting, in the streaming mode of said codec, in which a data stream is received via a streaming channel, bit errors in said data stream, means for estimating a bit error rate in said data stream, and means for fading the audio signal output from the codec. This allows the output signal from the codec to be faded rather than being abruptly disrupted, which would otherwise be disturbing to the user of the hearing aid.

In a particular embodiment the codec decoder comprises means for receiving the number of detected errors from the channel decoder and means for setting the excitation signal to the predictor to zero or the null-vector when errors are detected, zero representing the specific case of a one dimensional null-vector. This minimizes the effect of the transmission error on the predictor.

The invention, in a second aspect, provides a method of encoding an audio signal in a hearing aid, said method incorporating the steps of providing a digital audio input signal, generating in a decoder processing part a decoded output signal based on an input quantization index, the decoder processing part comprising a predictor and a predictor adaptation block for receiving an excitation signal and outputting a prediction signal, providing an encoder processing part incorporating said decoder processing part, generating an output quantization index based in an the digital audio input signal, using said encoder processing part, decoding of quantization indices in a trial-and-error process yielding a number of different quantization indices, and selecting from said number of different quantization indices the quantization index yielding the least difference between the digital audio input signal and the prediction signal as the output quantization index, and updating said predictor using a recursive autocorrelation estimate basing its prediction on previous excitation signals corresponding to the previous output quantization indices.

BRIEF DESCRIPTION OF THE DRAWINGS

Embodiments of the method are found in the dependent claims and provide advantages corresponding to those described above.

The invention will now be described, based on non-limiting exemplary embodiments and with reference to the drawings where:

FIG. 3 is a schematic diagram of a memory holding prerecorded indices,

FIG. 4a shows a first example of a tree search,

FIG. 4b shows a second example of a tree search,

DETAILED DESCRIPTION OF THE INVENTION

Figure 1:
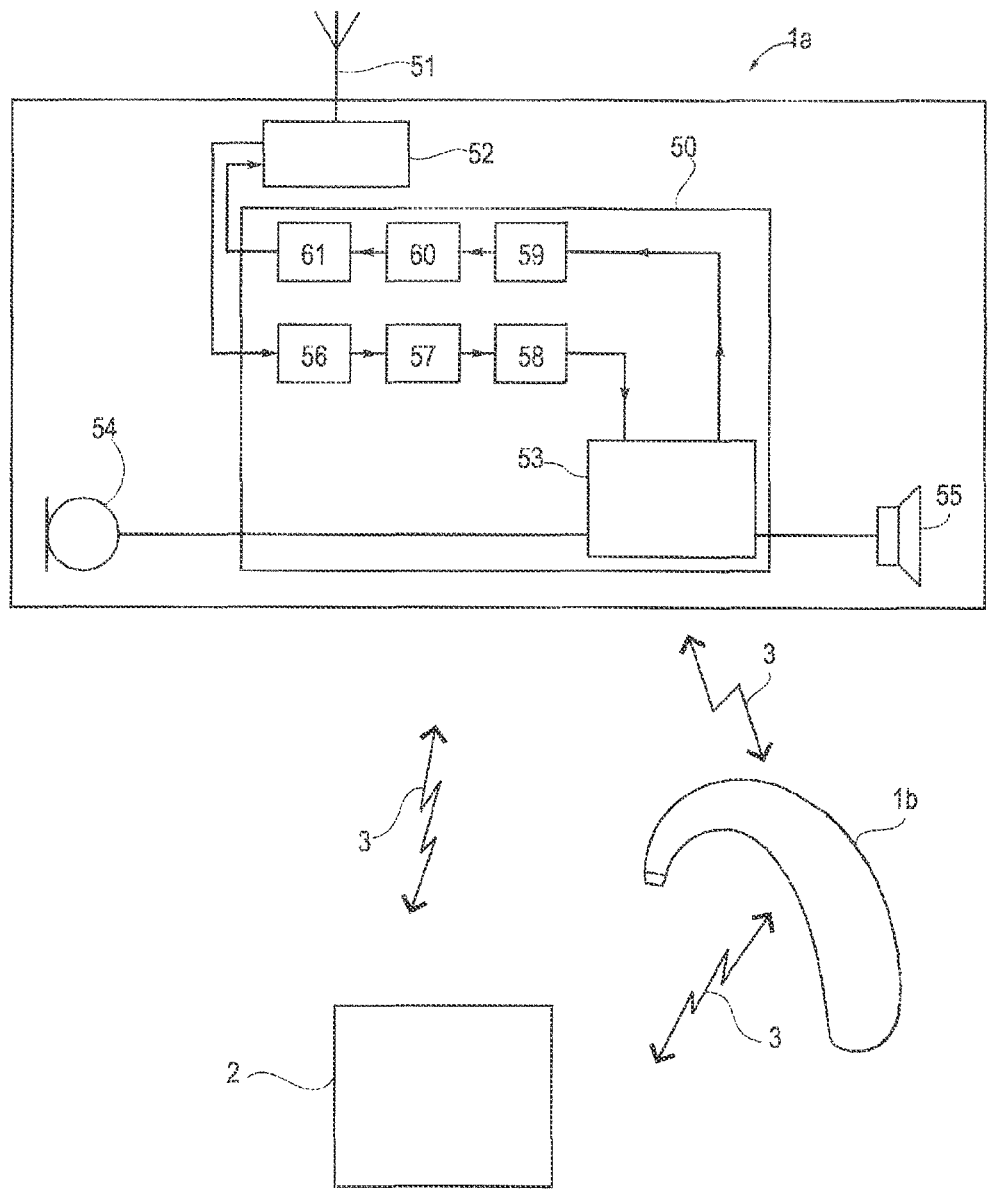
FIG. 1 schematically illustrates two hearing aids according to an embodiment of the invention and an external device.

FIG. 1 shows a first hearing aid 1a, a second hearing aid 1b and an external device 2. The first hearing aid 1a is shown in a schematic form, and the hearing aid 1b is suggested by its physical outline. Both hearing aids 1a and 1b are adapted to communicate with each other via a short-range wireless radio communications link 3. Likewise they are adapted to communicate with an external unit 2 via the short-range wireless radio communications link 3.

The hearing aid 1a hearing aid comprises an antenna 51, a wireless transceiver 52, a hearing aid processor 50, a microphone 54, and an acoustic output transducer 55. The wireless transceiver 52 is capable of receiving and transmitting a digitally encoded signal. The hearing aid processor 50 comprises an audio signal processor 53, an input channel decoder 56, an audio decoder 57, a post-processing block 58, an audio pre-processing block 59, an audio encoder 60 and an output channel encoder 61.

In reception mode, the audio signal processor 53 receives an input signal from the microphone 54, and conditions and amplifies it for reproduction by the acoustic output transducer 55 according to a hearing aid prescription. When the antenna 51 receives a wireless signal, the transceiver 52 demodulates the received signal into a channel stream for further processing by the hearing aid processor 50.

The demodulated channel stream is used as the input for the input channel decoder 56 of the hearing aid processor 50, where the channel stream is decoded. The decoded channel stream is used as the input bit stream for the audio decoder 57. The audio decoder 57 decodes the bit stream by synthesizing the corresponding audio signals using the codebook indices obtained from the bit stream and outputting a digital audio signal with a relatively low sample rate. The digital audio signal is used as the input for the post-processing block 58, where post-processing is performed on the digital audio signal. The post-processing involves filtering, conditioning and asynchronous sample rate conversion into a digital audio signal having a relatively higher sample rate in order for the received signal to be compatible with the audio signal processing in the audio signal processor 53. In this way, the sample rate of the received audio signal may be lower than the sample rate in the hearing aid 1a, allowing for a more efficient transmission because fewer bits have to be transmitted via the wireless transceiver 52.

In transmission mode, the audio processor 53 prepares a digital audio signal for transmission by the wireless transceiver 52 in the following way: A digital audio signal is fed to the audio preprocessing block 59 where the digital audio signal is resampled and converted into a digital audio stream with a lower sample rate. The digital audio stream is encoded into a bit stream in the encoder 60. This bit stream comprises a sequence of codebook quantization indices representing the digital audio signal. The bit stream is used as input for the output channel encoder 61, where a channel stream is generated. The channel stream from the output channel encoder 61 is fed to the input of the wireless transceiver 52 for modulation, and transmitted wirelessly via the antenna 51.

The bandwidth of the short range wireless radio communications link 3 is limited because the power consumption of the radio circuit in the hearing aid 1 has to be kept down due to the limited power resources in a hearing aid. A typical bandwidth for wireless signals would be from 100 kbit/s to 400 kbit/s.

One purpose for which the short range wireless radio communications link 3 is used is streaming of audio signals, e.g. streaming audio signals from one hearing aid to another, i.e. from one side of the head to another, in what is referred to as Contralateral Routing of Signals, or CROS. Signals may also be streamed to a hearing aid from an external device 2, e.g. in order to transmit, via the external device 2, audio from other sources, such as TV-sets, radios or the like.

Figure 2A:
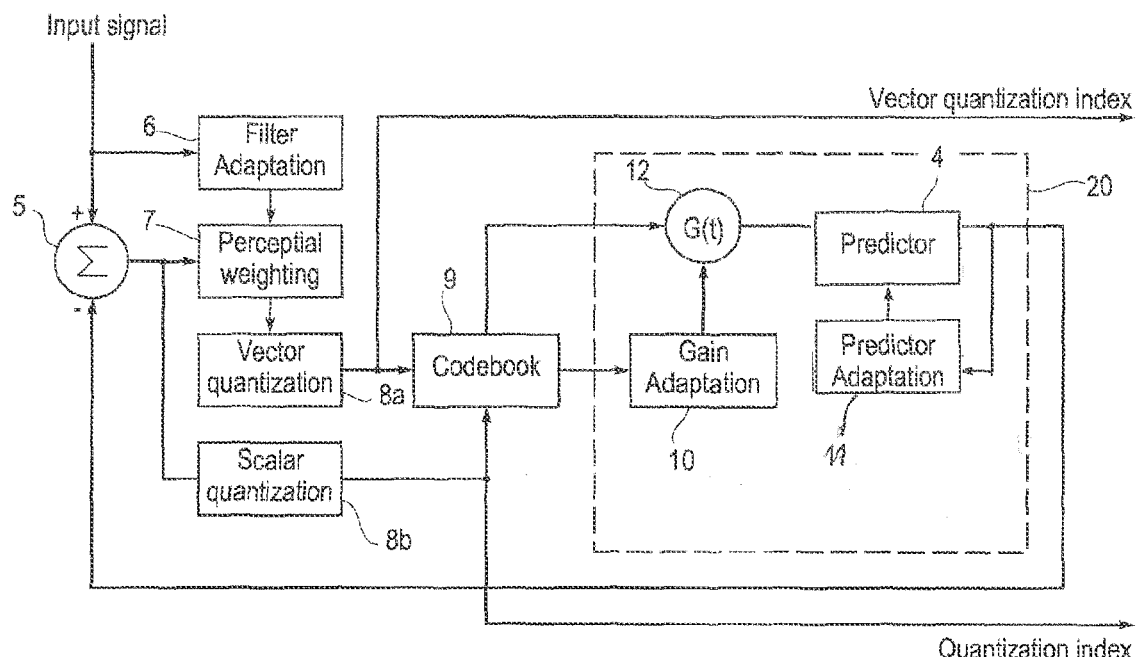
FIG. 2a illustrates a block diagram of a codec as encoder in either one of the hearing aids in FIG. 1.
Figure 2B:
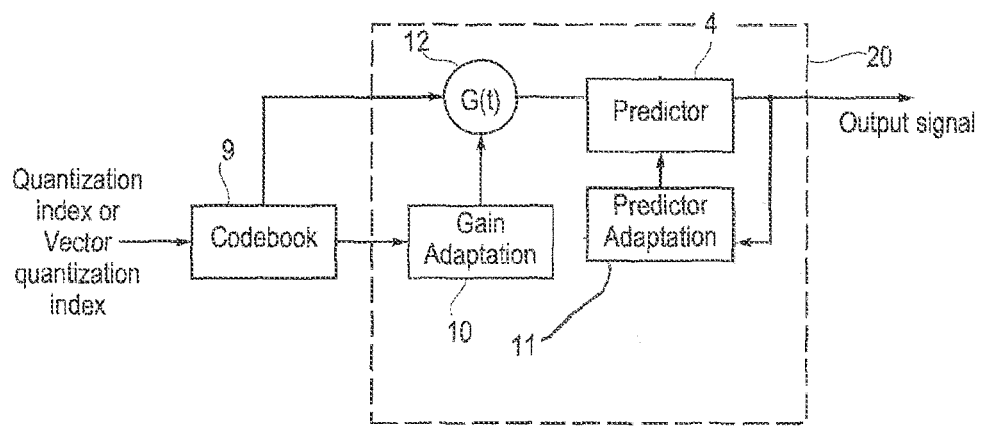
FIG. 2b illustrates a block diagram of a codec as decoder in either one of the hearing aids in FIG. 1

Because of the limited bandwidth of the short-range wireless radio communications link 3 it is, however, necessary to compress the audio signals to be transmitted. The hearing aid 1a, therefore comprises a codec according to the invention. The codec is illustrated in FIG. 2a and FIG. 2b as an encoder and a decoder, respectively. However, as will be readily appreciated by comparison of FIGS. 2a and 2b, and as explained in further detail below, the encoder incorporates the decoder. Thus, the hardware of the codec, i.e. the parts of the circuit chip on which the functionality of the codec is executed, may serve two purposes. This, in turn, means that the very same parts of hardware may constitute the hardware used with the encoding and decoding functionality, and redundancy of these parts of the chip is avoided. Valuable circuit chip space is thus saved in the hearing aid.

FIG. 2a is a block schematic showing an encoder according to the invention. The encoder comprises a first difference node 5, a filter adaptation block 6, a perceptual weighing block 7, a vector quantization block 8a, a scalar quantization block 8b, a codebook block 9, and a decoding sub-block 20. The decoding sub-block 20 comprises a gain adaptation block 10, an amplifier 12, a second difference node, a predictor block 4, and a predictor adaptation block 11.

A digital audio input signal enters the filter adaptation block 6 and the first difference node 5, and the output from the difference block 5 is fed either to the scalar quantization block 8b or to the input of the perceptual weighting block 7 for conditioning according to a perceptual weighting function. The perceptually weighted signal is then quantized into vectors in the vector quantization block 8a.

Depending on whether a scalar quantization or a vector quantization is used, the quantized vector or scalar indices, respectively, are fed to the corresponding input of the codebook block 9. The codebook block 9 outputs a shape index approximation and a gain index approximation from the indices to the decoding sub-block 20. In the decoding sub-block 20, a synthetic approximation of the instantaneous input signal is generated by repeatedly adapting the gain and the shape of the synthetic signal to the actual input signal. This approximation is performed by minimizing the error signal from the first difference node 5. Once the error signal is minimized, a vector quantization index or a scalar quantization index, as the case may be, is output from the encoder for transmission.

Error minimization is done by repeatedly comparing the input signal to a synthesized signal in a trial-and-error process yielding a number of different quantization indices as an output. Each of these different quantization indices is fed to the codebook 9. The output signal from the decoder sub-block 20 serves as an excitation signal for the predictor 4. At the end of the trial-and-error process, the quantization index yielding the least error in the subtraction node 5 is then selected as the output quantization index. The process is then performed repeatedly to provide a resulting output data stream suitable for transmission over the short range wireless radio communication link. This data stream is compressed as compared to the original sampled input signal, as it is only necessary to transmit the quantization indices for the codebook 9. The gain adaptor 10 scales the signal from the codebook 9 and controls the amplifier 12 in order to provide an amplified, decoded output signal for the predictor 4.

Figure 6:
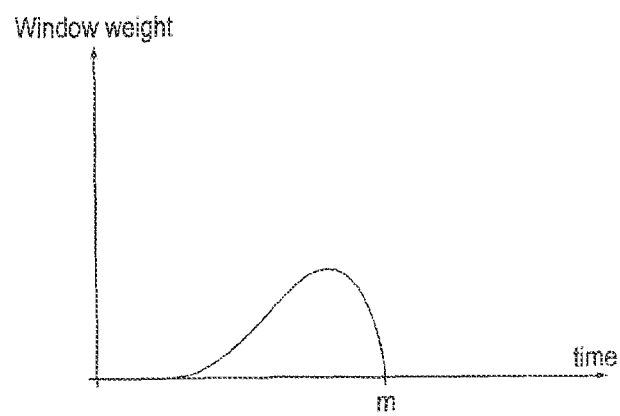
FIG. 6 shows a second-order recursive window used in the autocorrelation estimation.

The predictor 4 is controlled by the predictor adaptation block 11. The predictor adaptation block 11 is autorecursive, i.e. bases its prediction on previous excitation signals corresponding to the previous output quantization indices. FIG. 6 illustrates the weight applied to signal samples versus time in a window function as used in accordance with the present invention. The window function $W_m(n)$ is defined as:

$$W_m(n) = \begin{cases} 0 & \text{for } n \geq m \\ b_0 & \text{for } n = m-1 \\ -\sum_{k=1}^{K} a_k \cdot W_m(n-k) & \text{for } n < m-1 \end{cases}$$

Window-weighted signal $s_m$ at time m thus being:

$$s_m(n) = s(n) \cdot W_m(n)$$

Autocorrelation at time m with lag $\tau$ is:

$$R_m(\tau) = \sum_{n=-\infty}^{\infty} s_m(n) \cdot s_m(n-\tau)$$

Where $R_m$ is used as an input for a Levinson-Durbin algorithm yielding the predictor adaptation coefficients.

For values larger than m, $W_m(n)=0$ and consequently $s_m(n)=0$. Causal autocorrelation at time m with lag $\tau$ is thus given by the formula:

$$= \sum_{n=-\infty}^{m} s_m(n) \cdot s_m(n-\tau)$$

For the specific case of a second-order recursive window, the above formula reduces to:

$$R_m(\tau) = r_m(\tau) - (a_1 \cdot r_{m-1}(\tau) + a_2 \cdot r_{m-2}(\tau)), \text{ where}$$

$$r_m(\tau) = s_m(m-1) \cdot s_m(m-1-\tau)$$
$$= s(m-1) \cdot W_m(m-1) \cdot s(m-1-\tau) \cdot W_m(m-1-\tau)$$

If the auto recursive window is based on frames rather than single samples, the second-order autocorrelation window is given by:

$$R_m(\tau) = r_m(\tau) - (a_1 \cdot r_{m-L}(\tau) + a_2 \cdot r_{m-2L}(\tau))$$

Where $$r_m(\tau) = \sum_{l=1}^{L} s_m(m-l) \cdot s_m(m-l-\tau)$$
$$= \sum_{l=1}^{L} s(m-l) \cdot W_m(m-l) \cdot s(m-l-\tau) \cdot W_m(m-l-\tau)$$

and where L is the frame-length.

In order to limit the number of vectors that have to be kept in the codebook and searched through within the available timeframe, the vector quantization codebook preferably holds only normalized vectors, i.e. vectors of a unit length. The normalized vectors must subsequently be multiplied by a suitable gain factor in order to provide the correctly scaled vector. In the gain multiplication node 12, the normalized vector output from the encoding codebook 9 is multiplied by the gain factor from the gain adaptation block 10 in order to yield the excitation signal for the predictor 4.

The gain factor derivation is preferably based on a separate gain codebook, yielding a separate gain index to be included in the output quantization index.

The excitation signal X(t), which is presented to the predictor 4, thus follows the formula:

$$X(t) = (s(scbi_i) \cdot g(gcbi_i)) \cdot G(t)$$

Where s is the normalized shape vector from the shape code book, g is the instantaneous gain from the separate gain codebook and G is the global gain factor.

As can be seen form FIGS. 2a and 2b, the gain factor is also controlled adaptively by the gain adaptation block 10. When normalized gain indices are used, the gain adaption follows the recursive formula:

$$G(t) = \alpha \cdot T_g(gcbi) + (1-\alpha) \cdot G(t-1)$$

Where G is the gain value, t is the current sample, t−1 is the previous sample, $\alpha$ is a factor, and $T_g$(gcbi) is a mapping function of the gain values, gcbi, in the gain codebook. By appropriate choice of $\alpha$, the historical emphasis of the gain adaptation can be adjusted. The function $T_g$ is preferably a non-linear function, such as the power of 3. This allows the gain values of the gain codebook to cover a wide dynamic range though stored in only a few bits, thus three bits cover the range from 0 to 343, or 72 dB, rather than just the range from 0 to 7, or 26 dB.

As mentioned above, the available time for searching the codebook and trying out the resulting excitation signals is limited. It may therefore be difficult or even impossible to search through all quantization vectors in the encoder codebook within a given timeframe. It is therefore preferred to classify the vectors in a tree structure and perform a tree search of first an appropriate class, and then the best quantization vector in that class. As illustrated in FIG. 4a, the M·N quantization vectors $V_{11}$ to $V_{MN}$ have been arranged in classes $C_1$ to $C_M$. The maximum number of searches to be performed is hereby reduced from M·N to M+N.

However, classifying the vectors in this manner potentially excludes the best vector because it may actually be in a different class. If sufficient time is available, this drawback may be mitigated if some redundancy is introduced in the classes, that is, some classes contain copies of vectors from other classes. This is illustrated in FIG. 4b, where the class $C_1$ has a copy of the element $V_{21}$ from the class $C_2$. Thus, unlike the codebook illustrated in FIG. 4a, where each individual quantization index is unique to a specific branch of the searching tree, at least one individual quantization index, such as $V_{21}$, is found in more than one branch of the searching tree.

If the hearing aid, or the chip on which the codec hardware is realized, has sufficient processing power, it is possible to calculate the quantization vector analytically as an alternative to looking up the vector in a codebook. This saves the memory necessary to store a codebook.

Evidently, the skilled person will understand that the embodiment having a structured search tree codebook structure, the embodiment having a redundancy search tree codebook structure, and the embodiment having means for calculating the quantization vector analytically are preferred embodiments, but that an embodiment incorporating a full search in the encoding codebook 9 is not excluded.

As can be seen from FIG. 1, the hearing aid 1a may comprise a post-processing stage 58. The same is the case for the hearing aid 1b, but not visible in the figure. This post-processing stage 58 may comprise various kinds of post-processing, such as sample rate conversion, output fading and other post-filtering operations.

Figure 5:
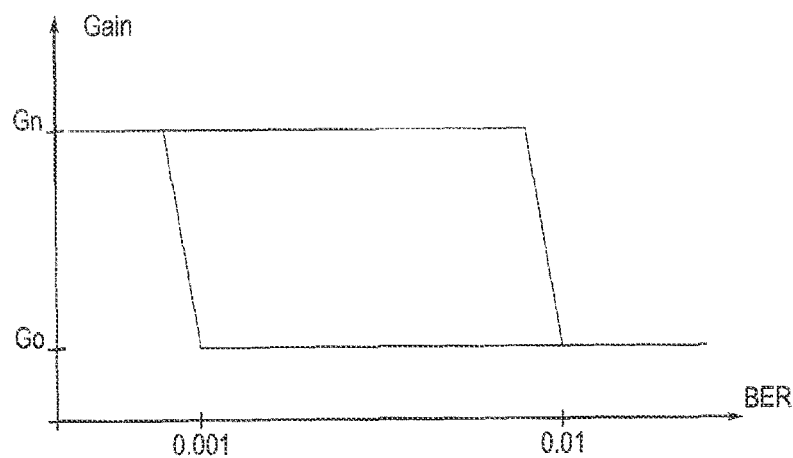
FIG. 5 is shows the gain fading as a function of the bit error rate.

When operating in the streaming mode, the quality of the output data stream of indices received depends on the objective signal quality of the short-range wireless radio communications link. If the signal received becomes too weak, or becomes disturbed by interfering radio signals or the like, the data stream of indices will contain more and more errors as the signal deteriorates. In order to avoid having the reproduced output signal breaking down in a disturbing manner due to the presence of too many errors in the data from the output data stream, the hearing aid comprises means for detecting errors in the output data stream received over the short-range wireless radio communications link 3. If the error rate becomes higher than a predetermined error rate, the post-processing block 58 fades out the signal in a graceful manner, i.e. it turns down the output signal level over a short period of time. Thus, the potentially rather disturbing noise produced by other digital streaming signal systems when the error rate becomes too high is avoided. Preferably, as illustrated in FIG. 5 this fading is performed by constantly measuring the bit error rate (BER) in the data stream and using the BER to control a gain reduction based on a hysteresis. Whenever the BER is above, say, 0.01 errors per bit, i.e. the signal quality is poor, the output gain is reduced to the low value $G_0$. If the BER falls below 0.001 errors per bit, i.e. the signal quality is good, then the output gain is increased to the nominal value $G_n$.

The channel encoder 61 for the streaming is preferably a Forward Error Correction code (FEC code). The FEC code error correction (ec) and detection capability (dc) is determined by the Hamming distance t, where the relationship $2*ec+dc<t$. From this relationship it is seen that detection is a simpler scheme. In this invention we may set the excitation signal, i.e. the input to the predictor 4, to zero or the null-vector whenever errors are detected. This has the effect that the transmission error has minimal influence on the predictor 4, because the erroneous input is not introduced. Furthermore, the gain is updated with a zero in the gain adaptation block 10, which results in the fading of the gain in case of consecutive transmission errors.

To obtain very low computational complexity, a Hamming code is applied in the preferred embodiment Using e.g. Ham (24,18) having a Hamming distance of 4 hence allows the detection of up to two errors or the correction of one.

We claim:

1. A hearing aid comprising an audio codec, said codec having
    a decoder processing part comprising a decoding sub-block and adapted to generate a decoded output signal based on an input quantization index, said decoding sub-block comprising a predictor and a predictor adaptation block for receiving an excitation signal and outputting a prediction signal, wherein said predictor adaptation block uses a recursive autocorrelation estimate, basing its prediction on previous excitation signals corresponding to the previous output quantization indices, for updating the predictor,
    an encoder processing part for generating an output quantization index based on a digital audio input signal, said encoder processing part including said decoding sub-block,
    wherein an output from the decoding sub-block provides said decoded output signal when the audio codec operates as a decoder, and is applied as said prediction signal when the audio codec operates as an encoder;
    said encoder processing part being adapted for decoding of the quantization indices in a trial-and-error process yielding a number of different quantization indices, and selecting from said number of different quantization indices the quantization index yielding the least difference between the digital audio input signal and the prediction signal as the output quantization index, and
    said codec being configured to selectively switch between a scalar quantization mode and a vector quantization mode.

2. The hearing aid according to claim 1, comprising a memory adapted for storing at least one predetermined sequence of quantization indices, and means for feeding said predetermined sequence to the codec.

3. The hearing aid according to claim 1, wherein said encoder processing part comprises a codebook comprising a plurality of quantization indices, where said quantization indices are arranged in a searchable manner in a tree structure with a number of quantization indices arranged in different branches, and where each individual quantization index is unique to a specific branch.

4. The hearing aid according to claim 1, wherein said encoder processing part comprises a codebook comprising a plurality of quantization indices, where said quantization indices are arranged in a searchable manner in a tree structure with a number of quantization indices arranged in different branches, and where at least one individual quantization index is found in more than one branch.

5. The hearing aid according to claim 1, wherein said encoder processing part comprises a computing device adapted to calculate quantization indices directly from the digital audio input signal and the prediction signal.

6. The hearing aid according to claim 1, wherein said decoder processing part comprises a shape codebook and a gain codebook, respectively, for providing a quantization vector representing a shape value and a gain value, respectively.

7. The hearing aid according to claim 6, wherein said gain adaptor is a backward adaptive gain adaptor.

8. The hearing aid according to claim 1, wherein said predictor is adapted for using a recursive autocorrelation estimate based on a second- or higher-order autocorrelation model.

9. The hearing aid according to claim 1, comprising a sample rate converter for altering the sample rate of an audio signal prior to being encoded by the codec.

10. The hearing aid according to claim 1, comprising means for detecting differences in digital clock frequencies between the transmitter and receiver in the transmitted signal and means for modifying the decoded audio signal in order to compensate for the detected differences.

11. The hearing aid according to claim 10, wherein the means for detecting said differences in clock signal frequencies is a digital phase-locked loop (PLL).

12. The hearing aid according to claim 1, comprising means for detecting in the streaming mode of said codec, in which a data stream is received via a streaming channel, bit errors in said data stream,
    means for estimating a bit error rate in said data stream, and
    means for fading the audio output from the codec.

13. The hearing aid according to claim 12, wherein the decoder processing part comprises means for receiving the number of detected errors from the channel decoder and means for setting the excitation signal to the predictor to zero or the null-vector when uncorrectable errors are detected.

14. A method of managing an audio codec adapted for coding and decoding of a digital audio stream, wherein the audio codec comprises a decoder processing part including a decoding sub-block having a predictor and a predictor adaptation block for receiving an excitation signal and outputting a prediction signal, and an encoder processing part incorporating said decoding sub-block, said method comprising the steps of provided a digital audio input signal, wherein said digital input signal is either a digital audio input signal when the audio codec operates as an encoder, or an input quantization index signal when the audio codec operates as a decoder;

generating in said decoder processing part a synthesized signal based on said input quantization index;

generating an output quantization index based on the digital audio input signal, using said encoder processing part operating selectively in one of a scalar quantization mode and a vector quantization mode, decoding of quantization indices in a trial-and-error process yielding a number of different quantization indices, and selecting from said number of different quantization indices the quantization index yielding the least difference between the digital audio input signal and the prediction signal as the output quantization index, and updating said predictor using a recursive autocorrelation estimate basing its prediction on previous excitation signals corresponding to the previous output quantization indices:

applying the synthesized signal from the decoder processing part as said prediction signal when the audio codec operates as an encoder; and applying the synthesized signal from the decoder processing part as a decoded output signal when the audio codec operates as a decoder.

15. The method according to claim 14, wherein said repeated decoding comprises the searching of a codebook comprising a plurality of quantization indices, where said quantization indices are arranged in a searchable manner in a tree structure with a number of quantization indices arranged in different branches, and where each individual quantization index is unique to a specific branch.

16. The method according to claim 14, wherein said repeated decoding comprises the searching of a codebook comprising a plurality of quantization indices, where said quantization indices are arranged in a searchable manner in a tree structure with a number of quantization indices arranged in different branches, and where at least one individual quantization index is found in more than one branch.

17. The method according to claim 14, wherein said repeated decoding comprises calculating quantization indices directly from the digital audio input signal and the prediction signal using a computing device.

18. The method according to claim 14, wherein a quantization vector representing a shape value and a gain value is provided using a shape codebook and a gain codebook, respectively.

19. The method according to claim 14, wherein said predictor is a backward adaptive gain adaptor, which is adapted using a recursive autocorrelation estimate based on a second- or higher-order autocorrelation model.

20. The method according to claim 14, in which a data stream is received via a streaming channel, bit errors in said data stream are detected, and the audio output from the codec is faded upon detection of bit errors.

21. The method according to claim 20, wherein the number of detected errors from the channel decoder is provided to the codec and the excitation signal to the predictor is set to zero or the null-vector when uncorrectable errors are detected.

22. The hearing aid according to claim 1, wherein said decoding sub-block comprises decoder circuit hardware parts implementing decoder functions and formed on a circuit chip.

23. The method according to claim 14, wherein said decoding sub-block comprises decoder circuit hardware parts implementing decoder functions and formed on a circuit chip.

24. An audio codec implemented in a processing chip and adapted for coding or decoding of a digital audio stream, and having a decoder processing part adapted to generate a decoded output signal based on an input quantization index and comprising decoding sub-block having a predictor and a predictor adaptation block for receiving an excitation signal and outputting a prediction signal, wherein said predictor adaptation block uses a recursive autocorrelation estimate, basing its prediction on previous excitation signals corresponding to the previous output quantization indices, for updating the predictor, an encoder processing part for generating an output quantization index based on a digital audio input signal, said encoder processing part incorporating said decoding sub-block, said encoder processing part being adapted for decoding of the quantization indices in a trial-and-error process yielding a number of different quantization indices, and selecting from said number of different quantization indices the quantization index yielding the least difference between the digital audio input signal and the prediction signal as the output quantization index, wherein an output from the decoding sub-block provides said decoded output signal when the audio codec operates as decoder, and wherein the output from the decoding sub-block is applied as said prediction signal when the audio codec operates as encoder; and said codec being configured to selectively switch between a scalar quantization mode and a vector quantization mode.

25. The hearing aid according to claim 22, wherein said decoder circuit hardware parts include said predictor and predictor adaptation block.

26. The method according to claim 23, wherein said decoder circuit hardware parts include said predictor and predictor adaptation block.

* * * * *